(12) United States Patent
Reichart et al.

(10) Patent No.: US 7,646,320 B1
(45) Date of Patent: Jan. 12, 2010

(54) CIRCUIT WITH SELECTABLE DATA PATHS

(75) Inventors: Johannes Reichart, Stuttgart (DE); Peter Gregorius, Munich (DE); Manfred Berroth, Sindelfingen (DE); Markus Groezing, Stuttgart (DE)

(73) Assignee: Qimonda AG, Munich (DE)

( * ) Notice: Subject to any disclaimer, the term of this patent is extended or adjusted under 35 U.S.C. 154(b) by 1 day.

(21) Appl. No.: 12/193,698

(22) Filed: Aug. 18, 2008

(51) Int. Cl.
*H03M 9/00* (2006.01)

(52) U.S. Cl. .................................. 341/100; 341/101

(58) Field of Classification Search .......... 341/100–101
See application file for complete search history.

(56) References Cited

U.S. PATENT DOCUMENTS

| | | | |
|---|---|---|---|
| 6,734,813 B2 * | 5/2004 | Nakao et al. ................ | 341/100 |
| 7,165,153 B2 | 1/2007 | Vogt | |
| 7,184,360 B2 | 2/2007 | Gregorius et al. | |
| 7,450,039 B2 * | 11/2008 | Yoshizaki ................... | 341/101 |

OTHER PUBLICATIONS

Gu, Zheng et al., "Cascading Techniques for a High-Speed Memory Interface," IEEE International Solid-State Circuits Conference, Session 12, Gigabit CDRs and Equalizers, pp. 21-23 (Feb. 13, 2007).
Li, Miao et al., "A 10Gb/s Transmitter with Multi-Tap FIR Pre-Emphasis in 0.18 μm CMOS Technology," IEEE, ASP-DAC, pp. 679-682 (2005).

* cited by examiner

*Primary Examiner*—Lam T Mai
(74) *Attorney, Agent, or Firm*—Dicke, Billig & Czaja, PLLC

(57) ABSTRACT

A first data path is coupled between a data input and a data output of a circuit. A second data path is coupled between the data input and the data output. The first data path includes a parallelization circuit coupled to the data input to receive a serial data signal and configured to generate a parallelized data signal from the serial data signal, a first sampling circuit coupled to the parallelization circuit and configured to sample the parallelized data signal, and a serialization circuit coupled to the first sampling circuit and configured to serialize the sampled parallelized data signal. The second data path includes a second sampling circuit coupled to the data input and configured to sample the serial data signal. A selection circuit is configured to select between the first data path and the second data path.

25 Claims, 4 Drawing Sheets

CIRCUIT WITH SELECTABLE DATA PATHS

BACKGROUND

Various technologies employ techniques that forward a high-speed serial data signal from one integrated circuit to another integrated circuit. One example of such technologies is semiconductor memory technology. Some semiconductor memory systems couple a plurality of memory chips with each other and forward a high-speed serial data signal from one memory chip to the other so as to accomplish read or write operations. In this respect, some semiconductor memory systems use two different data propagation modes for forwarding a serial data signal from one memory chip to the other: a transparent mode and a resample mode.

In the transparent mode, the serial data signal is received at a data input of the memory chip and transmitted via a transparent data path to a data output of the memory chip. In the resample mode, the serial data signal is received at the data input and transmitted via a resample path to the data output. In the resample path, the serial data signal is parallelized and then the parallelized data signal is sampled. The sampled parallelized signal is then reserialized and transmitted to the data output. The transparent data path provides no parallelization and no sampling of the data signal. The transparent data path thus offers a reduced latency as compared to the resample data path. As compared to the transparent data path, the resample data path offers an improved quality of the serial data signal at the data output of the memory chip. In this type of semiconductor memory system, there is a limitation on the speed of the serial data signal transmitted between the memory chips and on the number of memory chips (also referred to as ranks) which can be connected in series.

For these and other reasons, there is a need for the present invention.

SUMMARY

One embodiment provides an integrated circuit including a data input, a data output, a first data path, a second data path, and a selection circuit. The first data path is coupled between the data input and the data output and includes a parallelization circuit coupled to the data input to receive a serial data signal and configured to generate a parallelized data signal from the serial data signal, a first sampling circuit coupled to the parallelization circuit and configured to sample the parallelized data signal, and a serialization circuit coupled to the first sampling circuit and configured to serialize the sampled parallelized data signal. The second data path is coupled between the data input and the data output and includes a second sampling circuit coupled to the data input and configured to sample the serial data signal. The selection circuit is configured to select between the first data path and the second data path.

In other embodiments, different circuits, devices or methods may be provided.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
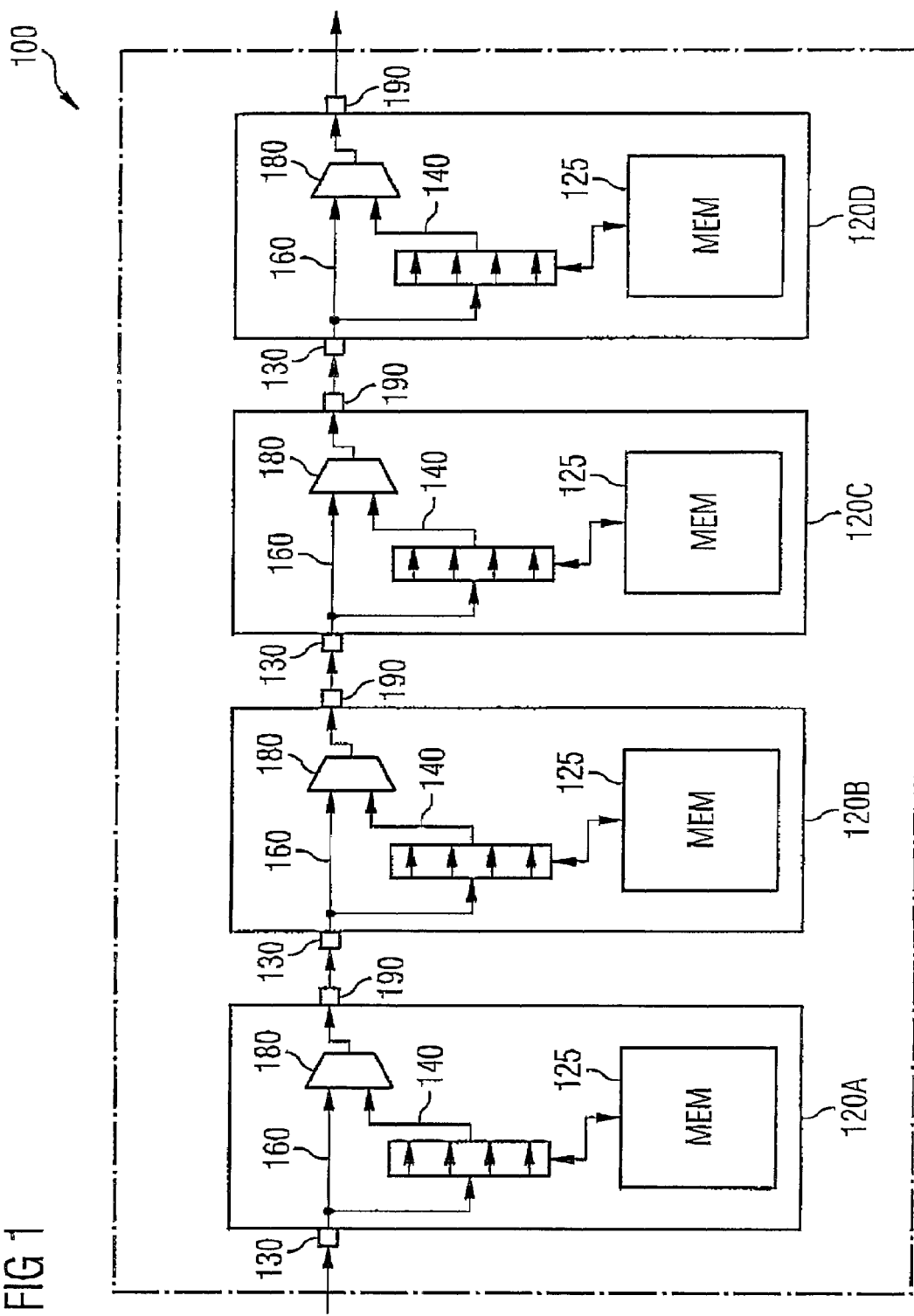
FIG. 1 schematically illustrates a memory module according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other as appropriate, unless specifically noted otherwise.

Further, it is to be understood that in the following description of embodiments any direct connection or coupling (i.e., any connection or coupling without intervening elements) between functional blocks, devices, components, circuit elements or other physical or functional units illustrated in the drawings or described herein could also be implemented by an indirect connection or coupling (i.e., a connection or coupling comprising one or more additional intervening elements). In addition, it is to be noted that the description of an embodiment which comprises a plurality of elements or components is not to be construed as indicating that all these elements are necessary for practicing embodiments of the present invention. Also, it is to be understood that features of different embodiments described hereinafter may be combined with each other as appropriate.

In the following, embodiments will be described in more detail by referring to the accompanying drawings. The embodiments described hereinafter relate to integrated circuits comprising a memory circuit (i.e., memory chips) to an arrangement of such integrated circuits (e.g., in a memory module) and to methods of operating such integrated circuits. The memory chips may be dynamic random access memory (DRAM) type memory chips. However, it is to be understood that the described concepts could also be applied to other types of memory chips or to other types of integrated circuits which require forwarding of a serial data signal from one integrated circuit to another integrated circuit.

Embodiments relate to a circuit with selectable data paths which are coupled between a data input and a data output for forwarding a data signal.

FIG. 1 schematically illustrates a memory module 100 according to an embodiment. The memory module 100 comprises a printed circuit board 110 and a plurality of integrated circuits 120A, 120B, 120C, 120D arranged on the printed circuit board 110. Each of the integrated circuits 120A, 120B, 120C, 120D comprises a memory circuit 125 (denoted by MEM). The memory circuit 125 may be an array of DRAM cells or the like.

For coupling each of the integrated circuits 120A, 120B, 120C, 120D to further circuitry, such as a memory controller or a processor, the integrated circuits 120A, 120B, 120C, 120D are coupled to each other in a chain configuration, and a serial data signal is received from the other circuitry in one of the integrated circuits 120A, 120B, 120C, 120D (e.g., in the integrated circuit 120A) and then forwarded to the other integrated circuits. Similarly, a serial data signal generated within one of the integrated circuits (e.g., based on memory contents) may be forwarded to one or more of the integrated circuits and then to the other circuitry.

For at least this purpose, each of the integrated circuits comprises a data input 130 and a data output 190. In the illustrated example, the integrated circuit 120A receives a serial data signal from the other circuitry at its data input 130 and outputs a serial data signal at its data output 190. The integrated circuit 120B is coupled with its data input 130 to the data output 190 of the integrated circuit 120A and outputs a serial data signal at its data output 190. The integrated circuit 120C is coupled with its data input 130 to the data output 190 of the integrated circuit 120B and outputs a serial data signal at its data output 190. The integrated circuit 120D is coupled with its data input 130 to the data output 190 the integrated circuit 120C and outputs a serial data signal at its data output 190. The serial data signal at the data output 190 of the integrated circuit 120D may then be transmitted to the other circuitry.

The serial data signal may comprise memory write data, memory read data, and/or memory control data (e.g., command data or address data). Each of the integrated circuits 120A, 120B, 120C, 120D may actually comprise a plurality of data inputs and data outputs of the illustrated type and that the serial data signal may correspond to a multibit serial data signal which is transmitted via a number of parallel signal lines. According to an example embodiment, six parallel data lines may be used for transmitting a multibit serial data signal. In this example embodiment, each of the integrated circuits would be provided with six data inputs 130 and six data outputs 190.

As schematically illustrated in FIG. 1, in each of the integrated circuits 120A, 120B, 120C, 120D, a first data path 140 is coupled between the data input 130 and the data output 190. The first data path comprises parallelization circuit coupled to the data input 130 to receive a serial data signal and configured to generate a parallelized data signal therefrom, and a reserialization circuit configured to reserialize the parallelized data signal. Accordingly, the first data path 140 may also be referred to as a parallelized data path. In the parallelized portion of the first data path 140 (i.e., between the parallelization circuit and the reserialization circuit) the propagation speed of the data signal is reduced. According to some embodiments, processing of the data signal may take place in the parallelized portion of the first data path 140. For example, as schematically illustrated in FIG. 1, a coupling of the memory circuit 125 may be provided in the parallelized section of the first data path 140.

As further illustrated, each of the integrated circuits 120A, 120B, 120C, 120D comprises a second data path 160 coupled between the data input 130 and the data output 190. As compared to the first data path 140, the second data path 160 comprises no parallelization circuit and no reserialization circuit. Accordingly, the second data path 160 may also be referred to as a non-parallelized data path.

A selection circuit (e.g., comprising a multiplexer 180) is provided in each of the integrated circuits 120A, 120B, 120C, 120D, for selecting between the first data path 140 and the second data path 160.

Figure 2:
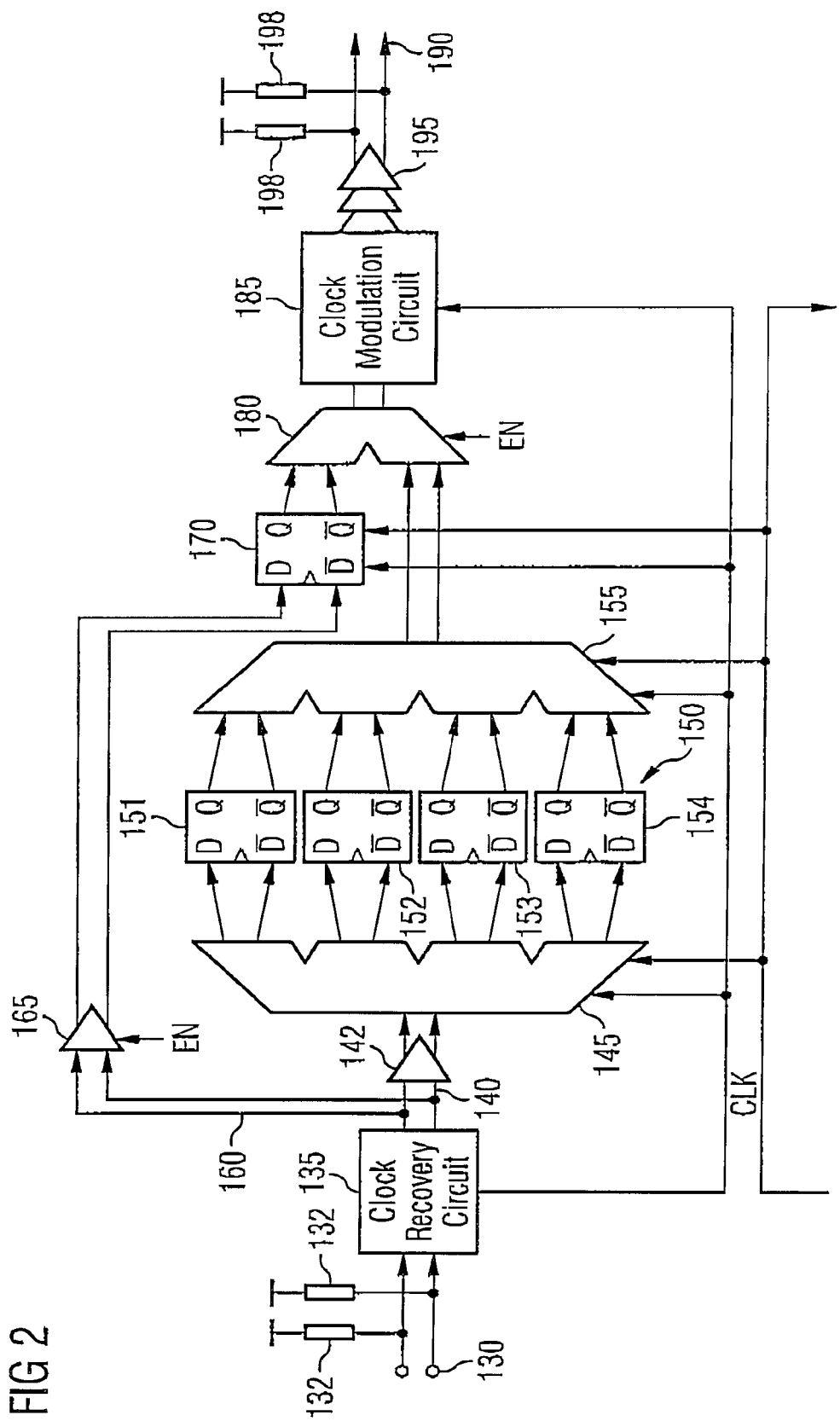
FIG. 2 schematically illustrates a circuit structure within an integrated circuit according to an embodiment.

FIG. 2 schematically illustrates a circuit structure in an integrated circuit according to an embodiment. For example, the integrated circuit may be of substantially the same type as the integrated circuits 120A, 120B, 120C, 120D illustrated in FIG. 1. In FIG. 2, components which correspond to those of FIG. 1 are designated with the same reference signs.

The circuit structure as illustrated in FIG. 1 is configured to forward a data signal from a data input 130 of the integrated circuit to a data output 190 of the integrated circuit. The data signal is received at the data input 130 in the form of a serial data signal and is output from the data output 190 in the form of a serial data signal. The data signal may actually be a multibit serial data signal and the integrated circuit may be provided with a plurality of the circuit structures as illustrated in FIG. 2, depending on the number of bits of the multibit serial data signal. According to an example embodiment, the number of bits of the multibit serial data signal is six.

As illustrated in FIG. 2, there is a first data path 140 through the integrated circuit from the data input 130 to the data output 190. The first data path 140 may also be referred to as a parallelized data path. Further, there is a second data path 160 from the data input 130 to the data output 190. The second data path may also be referred to as non-parallelized data path. According to the illustrated example, both the first data path and the second data path are of a differential type and comprise two signal lines for transmitting complementary signals. The use of differential-type data paths allows for an increased effective signal amplitude (e.g., an increased peak-to-peak voltage swing) and for reduced crosstalk between different signal lines. According to other embodiments, the first data path 140 and/or the second data path 160 may be of a single-ended type.

In the following, the components of the first signal path 140 will be explained proceeding in a downstream direction (i.e., in a direction from the data input 130 to the data output 190).

As illustrated, coupled to the data input 130 in the downstream direction, the first data path 140 comprises a pair of input load resistors 132. Further, the first signal path 140 comprises a clock recovery circuit 135 which receives the serial data signal from the data input 130 and generates a clock signal CLK based on the received serial data signal. In the illustrated example, the clock signal CLK is of a differential type comprising a first signal portion and a complementary second signal portion. In the illustrated example, the clock recovery circuit 135 generates the first signal portion of the clock signal CLK, and the complementary second signal portion is generated by another clock recovery circuit (not illustrated). In other embodiments, a single-ended clock signal may be used or the clock recovery circuit 135 may generate both the first signal portion and the complementary second signal portion of the differential clock signal CLK. According to an example embodiment, the clock signal CLK may have a frequency of 1 GHz or more, typically 4 GHz or more.

Arranged downstream from the clock recovery circuit 135, the first signal path 140 comprises a buffer 142 which buffers the serial data signal received from the clock recovery circuit 135 and outputs a buffered serial data signal.

Arranged downstream from the buffer 142, the first data path 140 comprises a parallelization circuit in the form of a demultiplexer 145 which receives the buffered serial data signal from the buffer 142 and generates a parallelized data signal therefrom. The demultiplexer 145 is controlled based on the clock signal CLK received from the clock recovery circuit 135. In the illustrated example, the demultiplexer 145 is of a four-fold type (i.e., parallelizes the serial data signal to four parallel data paths). In other embodiments, other types of parallelization circuits may be used (e.g., accomplishing a parallelization to a larger or to a smaller number of parallel data paths).

Arranged downstream from the multiplexer 145, the first data path 140 comprises a sampling circuit 150 configured to sample the parallelized data signal. In the illustrated example, the sampling circuit comprises a number of D-flip-flops 151, 152, 153, 154, one D-flip-flop for each of the parallel data paths. In the sampling circuit 150, the parallelized data signal is sampled based on a further clock signal (not illustrated) which may be derived from the clock signal CLK by frequency division. The sampled parallelized data signal may be supplied to other components of the integrated circuit (not illustrated in FIG. 2), such as the memory circuit 125 illustrated in FIG. 1.

Arranged downstream from the sampling circuit 150, the first data path 140 comprises a serialization circuit in the form of a multiplexer 155. The multiplexer 155 is controlled based on the clock signal CLK so as to accomplish a reserialization of the sampled parallelized data signal received from the sampling circuit 150. For at least this purpose, the multiplexer 155 comprises a number of inputs which corresponds to the number of parallel data paths of the parallelized data signal. The output of the multiplexer 155 is a reserialized data signal.

Arranged downstream from the serialization circuit, the first data path 140 comprises a multiplexer 180, which receives the reserialized data signal at a first input. The multiplexer 180 selects between the first data path 140 and the second data path 160. If the first data path 140 is selected, the output of the multiplexer 180 corresponds to the reserialized data signal received from the multiplexer 155.

Downstream from the multiplexer 180, the first data path 140 comprises a clock modulation circuit 185 configured to modulate the clock signal CLK onto the serial data signal output from the data output 190. The clock modulation circuit 185 modulates the first signal portion of the differential clock signal CLK onto the serial data signal output from the data output 190. In other embodiments, the clock signal may be a single-ended clock signal which is modulated onto the serial data signal to be output from the data output 190, or the clock modulation circuit 185 may modulate both the first signal portion and the complementary second signal portion of the differential clock signal CLK onto the serial data signal output from the data output 190.

According to an embodiment, the clock recovery circuit 135 and the clock modulation circuit 185 are configured in such a way that the common modes of two differential data signals of a multibit serial data signal are modulated for transmitting the differential clock signal CLK.

Arranged downstream from the clock modulation circuit 185, the first data path 140 comprises an output driver circuit 195 and a pair of output load resistors 198. The output driver circuit 195 may comprise a plurality of driver stages (e.g., a predriver stage and an output driver stage).

Next, the components of the second data path 160 will be described starting from the data input 130 and proceeding in the downstream direction to the data output 190.

In a first portion, the second data path 160 comprises the input load resistors 132 and the clock recovery circuit 135 coupled downstream to the data input 130. Accordingly, the first portion of the second data path 160 is common to a first portion of the first data path 140.

Downstream from the clock recovery circuit 135, the second data path 160 branches off from the first data path 140 and comprises a buffer 165 which receives the serial data signal which is output from the clock recovery circuit 135. The buffer 165 comprises a control input which receives an enable signal EN. The transmission of the serial data signal via the second data path can be enabled or disabled with the enable signal EN.

Arranged downstream from the buffer 165, the second data path 160 comprises a sampling circuit 170. If the second data path is enabled by the enable signal EN, the sampling circuit 170 receives as its input signal the buffered serial data signal from the buffer 165. In the illustrated example, the sampling circuit 170 comprises a D-flip-flop. The sampling circuit 170 has a clock input which receives the clock signal CLK from the clock recovery circuit 135. Accordingly, the sampling circuit 170 accomplishes sampling of the serial data signal based on the clock signal CLK. The sampling circuit outputs a sampled serial data signal.

Arranged downstream from the sampling circuit 170, the second data path 160 comprises the multiplexer 180 which receives the sampled serial data signal at a second input. As mentioned above, the multiplexer 180 selects between the first data path 140 and the second data path 160. For at least this purpose, the multiplexer 180 is controlled by the enable signal EN as well. If the second data path 160 is enabled by the enable signal EN, a signal corresponding to the sampled serial data signal received from the sampling circuit 170 of the second data path 160 is output from the multiplexer 180. If the second data path 160 is not enabled by the enable signal EN, a signal corresponding to the reserialized data signal received from the multiplexer 155 of the first data path 140 is output from the multiplexer 180.

Downstream from the multiplexer 180, the second data path 160 comprises the clock modulation circuit 185, the output driver circuit 195, and the load resistors 198. Accordingly, an end portion of the second data path 160 is the same as an end portion of the first data path 140.

As explained above, forwarding the data signal via the first data path 140 comprises parallelization of the received serial data signal and reserialization of the parallelized data signal. Accordingly, the first data path 140 may also be referred to as a parallelized data path. As compared to that, forwarding the data signal via a second data path 160 does not involve parallelization of the received serial data signal. Accordingly, the second data path 160 may also be referred to as a non-parallelized data path. As sampling of the data signal is accomplished in both the first data path 140 and the second data path 160, the first data path 140 may also be referred to as a first resampling path, and the second data path 160 may also be referred to as a second resampling path.

Due to sampling of the received serial data signal based on the clock signal CLK in the second data path 160, a low-latency data path is provided which at the same time provides for an improved signal quality of the forwarded serial data signal.

According to the illustrated example, the serial data signal as output from the data output 190 closely fits to the corresponding clock signal. Accumulation of jitter or other disturbances from one integrated circuit to another integrated circuit in a chain configuration (e.g., as illustrated in FIG. 1) is avoided. The maximum clock frequency on the basis of which the serial data signal can be transmitted thus does not depend on the signal integrity over all integrated circuits connected in series, but only on the signal integrity between two adjacent integrated circuits. This means that the second data path provides a low-latency data path which nonetheless allows for connecting a large number of integrated circuits in series. For example, assuming a frequency of the clock signal CLK of about 4.8 GHz a latency of the second data path 160 may be achieved which is below 0.5 ns.

Figure 3:
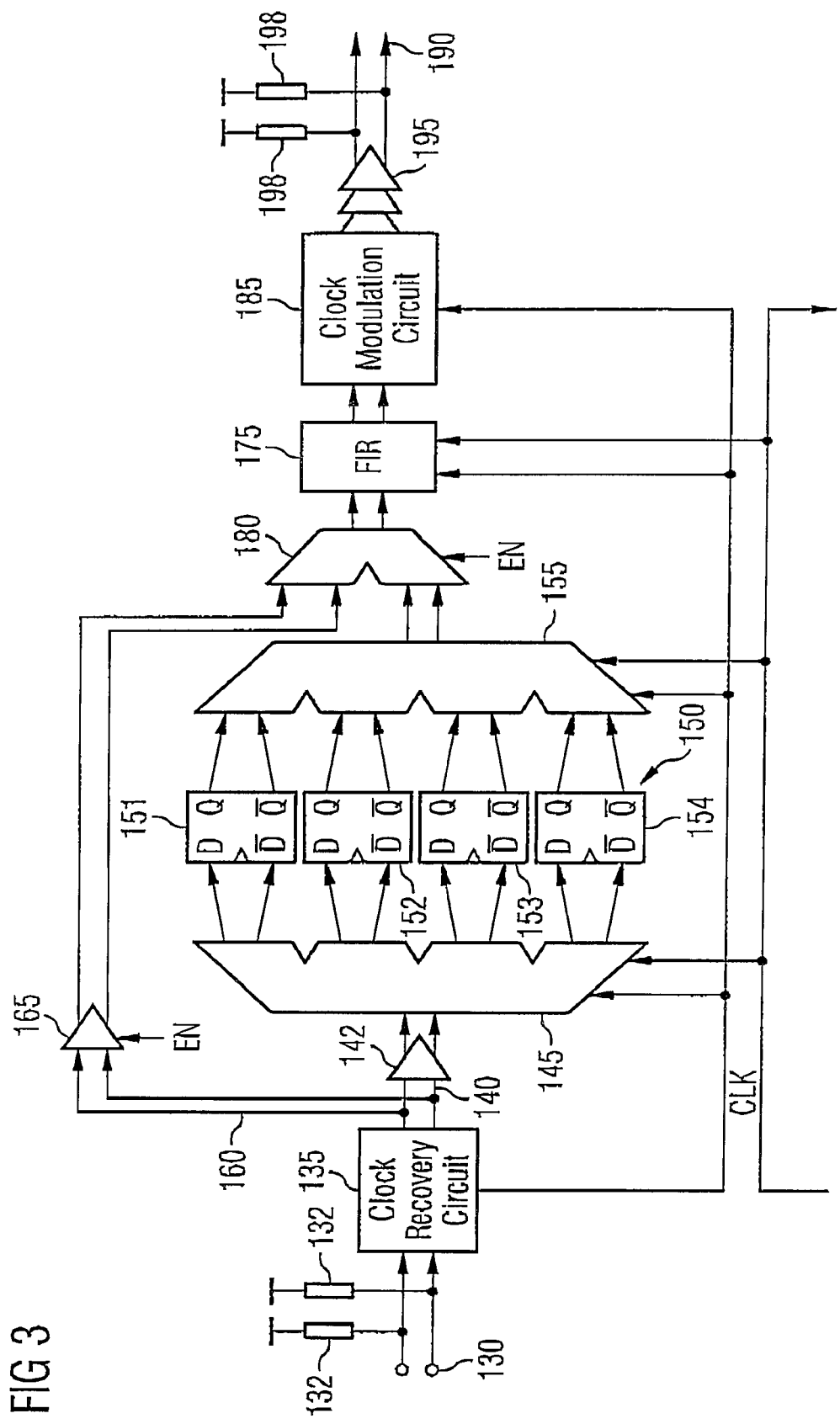
FIG. 3 schematically illustrates a circuit structure within an integrated circuit according to an embodiment.

FIG. 3 schematically illustrates a circuit structure in an integrated circuit according to an embodiment. The circuit structure of FIG. 3 generally corresponds to the circuit structure illustrated in FIG. 2 and similar components have been designated with the same reference signs. In the following, only the differences as compared to the circuit structure of FIG. 2 will be explained.

In the exemplary circuit structure of FIG. 3, the sampling circuit 170 in the second data path 160 has been replaced by a finite impulse response (FIR) filter 175 arranged in the second data path 160. In the illustrated example, the FIR filter 175 is arranged downstream from the buffer 165 and the multiplexer 180. Accordingly, the FIR filter 175 is arranged in the first data path 140 as well. In other embodiments, the FIR filter 175 may be arranged downstream from the buffer 165 but upstream from the multiplexer 180 (i.e., in the second data path 160 only). In this case, it would also be possible to arrange a further FIR filter in the first data path 140 (e.g., downstream from the multiplexer 155 but upstream from the multiplexer 180).

In the exemplary circuit structure of FIG. 3, if the second data path 160 is enabled by means of the enable signal EN, the FIR filter 175 receives the serial data signal via the non-parallelized data path. According to the illustrated example, the only processing of the serial data signal received by the FIR filter 175 when using the second data path 160 is buffering in the buffer 165.

The FIR filter 175 is configured to filter its input signal, which also involves sampling of the input signal, and to generate a filtered output signal. The FIR filter 175 comprises a clock signal input which receives the clock signal CLK generated by the clock recovery circuit 135. On the one hand, the FIR filter 175 accomplishes sampling of the serial data signal received from the data input 130 based on the clock signal CLK, and on the other hand accomplishes filtering of the serial data signal. The filtering generates a desired distortion of the serial data signal to be output at data output 190. This may also be referred to as preemphasis of the serial data signal.

According to an embodiment, the FIR filter 175 is of a baud-spaced type. In this case, the FIR filter 175 is a time discrete and value continuous filter in which the filtered data signal is delayed by typically one or more D-flip-flops. By suitably adjusting and selecting parameters of the FIR filter 175, dispersion of the transmitted serial data signal on a transmission channel (e.g., between two different integrated circuits) can be reduced or mitigated. If in the exemplary circuit structure of FIG. 3 the data signal is forwarded via the first data path 140, the same effects due to preemphasis of the serial data signal to be output from the data output 190 will be obtained without providing a separate FIR filter or other signal conditioning circuit in the first signal path 140.

Figure 4:
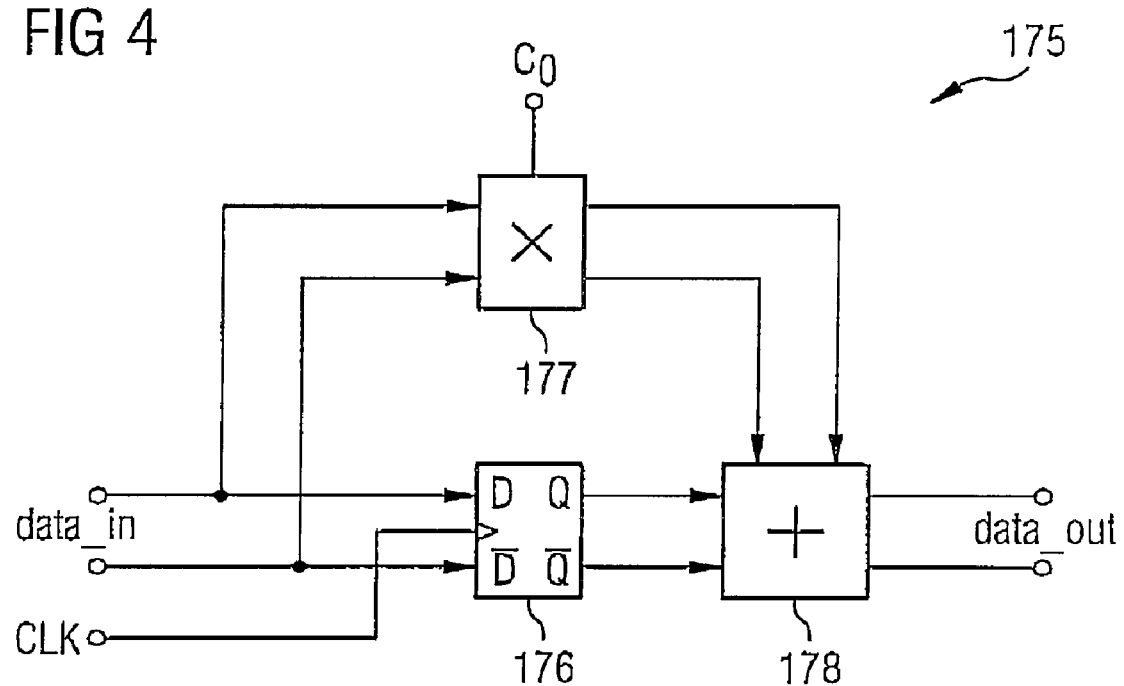
FIG. 4 schematically illustrates an example of a finite impulse response filter to be used in the circuit structure of FIG. 3 according to an embodiment.

FIG. 4 schematically illustrates a FIR filter which, according to an embodiment, may be used in the exemplary circuit structure of FIG. 3. The illustrated FIR filter comprises a sampling circuit in the form of a D-flip-flop 176. The clock signal CLK is supplied to a clock signal input of the D-flip-flop 176. Although the clock signal CLK is illustrated with only a single signal line, the clock signal CLK may be a differential clock signal as illustrated in FIG. 3.

A data input signal (data in) of the FIR filter 175 is supplied to the data input and to the complementary data input of the D-flip-flop 176 so as to be sampled based on the clock signal CLK.

The FIR filter 175 further comprises a multiplication stage 177 which receives the data input signal and multiplies the data input signal by a filter coefficient $c_0$. The output signal of the multiplication stage 177 thus corresponds to the data input signal scaled by the factor $c_0$. In typical embodiments, the coefficient $c_0$ is in the range from −1 to 1.

Further, the exemplary FIR filter 175 comprises an addition stage 178 which receives the sampled data input signal from the D-flip-flop 176 and the scaled data input signal from the multiplication stage 177. As the data input signal is sampled and held in the D-flip-flop 176, the sampled data input signal as output by the D-flip-flop 176 is delayed with respect to the data input signal. The addition stage 178 thus generates a data output signal (denoted by data out) of the FIR filter 175 which corresponds to the sum of the sampled and delayed data input signal as output by the D-flip-flop 176 and the scaled data input signal as output by the multiplication stage 177.

The FIR filter 175 as illustrated in FIG. 4 is of a single tap type. As illustrated, FIR filter 175 comprises only a single D-flip-flop, which keeps the delay of the filtered data output signal with respect to the data input signal small. Accordingly, the second data path 160 can be provided with a low latency. However, in other embodiments other types of FIR filters (e.g., FIR filters with more than one tap) could be used.

It is to be understood that the above-described embodiments are merely exemplary and are not construed to be limiting the scope of the present invention, and that numerous modifications and variations are possible without departing from the scope of the present invention. For example, although the above concepts have been described in connection with a differential clock signal, other embodiments could use a single-ended clock signal or a combination of a single-ended and a differential clock signal. Further, although the above embodiments have been described as involving fully differential data paths between the data input and the data output of the integrated circuit, other embodiments could use single-ended data paths or data paths which are in part single-ended and in part differential. Further, although in the above embodiments, the first data path and the second data path each comprise a separate buffer arranged downstream from the clock recovery circuit, other embodiments could use a single buffer arranged downstream from the clock recovery circuit both in the first data path and in the second data path (i.e., in a common portion of the first data path and the second data path). In some embodiments, it could also be possible to eliminate the buffer from the first data path and/or from the second data path. Also, the described techniques may be used to couple different integrated circuits together in various configurations. For example, in addition to the chain configuration as illustrated in FIG. 1, integrated circuits could also be coupled together in a star-type configuration, in a ring-type configuration, or the like. In an addition to a memory module, various other arrangements of integrated circuits are possible (e.g., a plurality of memory chips on a main board of a computer system or on a graphics card).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
a data input;
a data output;
a first data path coupled between the data input and the data output, the first data path comprising:
a parallelization circuit coupled to the data input to receive a serial data signal and configured to generate a parallelized data signal from the serial data signal,
a first sampling circuit coupled to the parallelization circuit and configured to sample the parallelized data signal, and
a serialization circuit coupled to the first sampling circuit and configured to serialize the sampled parallelized data signal;
a second data path coupled between the data input and the data output, the second data path comprising a second sampling circuit coupled to the data input and configured to sample the serial data signal; and
a selection circuit configured to select between the first data path and the second data path.

2. The integrated circuit of claim 1, comprising:
a memory circuit coupled to the first data path.

3. The integrated circuit of claim 1, comprising:
a clock recovery circuit coupled to the data input and configured to generate a clock signal based on the serial data signal.

4. The integrated circuit of claim 1, wherein the first data path and the second data path are of a differential type.

5. The integrated circuit of claim 1, comprising:
a finite impulse response filter arranged in the second data path.

6. The integrated circuit of claim 5, wherein the finite impulse response filter comprises the second sampling circuit.

7. The integrated circuit of claim 1, wherein the second sampling circuit comprises a D-flip-flop.

8. The integrated circuit of claim 1, comprising:
a buffer arranged between the data input and the second sampling circuit.

9. An integrated circuit, comprising:
a data input;
a data output;
a first data path coupled between the data input and the data output, the first data path comprising:
a parallelization circuit coupled to the data input to receive a serial data signal and configured to generate a parallelized data signal from the serial data signal,
a sampling circuit coupled to the parallelization circuit and configured sample the parallelized data signal, and
a serialization circuit coupled to the sampling circuit and configured to serialize the sampled parallelized data signal;
a second data path coupled between the data input and the data output, the second data path comprising a finite impulse response filter coupled to the data input and configured to filter the serial data signal; and
a selection circuit configured to select between the first data path and the second data path.

10. The integrated circuit of claim 9, wherein the finite impulse response filter is arranged in the first data path and in the second data path.

11. The integrated circuit of claim 9, wherein the finite impulse response filter is of a baud-spaced type.

12. The integrated circuit of claim 9, wherein the finite impulse response filter is of a single-tap type.

13. The integrated circuit of claim 9, comprising:
a buffer arranged in the second data path.

14. A memory module, comprising:
a first memory device; and
a second memory device,
wherein the first memory device comprises;
a first data path to forward a serial data signal to the second memory device,
a second data path to forward the serial data signal to the second memory device, and
a selection circuit configured to select between the first data path and the second data path,
wherein the first data path comprises:
a parallelization circuit configured to generate a parallelized data signal from the serial data signal,
a first sampling circuit coupled to the parallelization circuit and configured to sample the parallelized data signal, and
a serialization circuit coupled to the first sampling circuit and configured to serialize the sampled parallelized data signal, and
wherein the second data path comprises a second sampling circuit configured to sample the serial data signal.

15. The memory module of claim 14, comprising:
a printed circuit board;
a first integrated circuit comprising the first memory device; and
a second integrated circuit comprising the second memory device.

16. The memory module of claim 14, wherein the first data path and the second data path are of a differential type.

17. The memory module of claim 14, wherein the first memory device comprises a finite impulse response filter arranged in the second data path and the finite impulse response filter comprises the second sampling circuit.

18. An electronic device, comprising:
a first integrated circuit; and
a second integrated circuit,
wherein the first integrated circuit comprises:
a first data path to forward a serial data signal to the second integrated circuit,
a second data path to forward the serial data signal to the second integrated circuit, and
a selection circuit configured to select between the first data path and the second data path,
wherein the first data path comprises:
a parallelization circuit configured to generate a parallelized data signal from the serial data signal,
a first sampling circuit coupled to the parallelization circuit and configured to sample a parallelized data signal, and
a serialization circuit coupled to the first sampling circuit and configured to serialize the sampled parallelized data signal, and
wherein the second data path comprises a second sampling circuit configured to sample the serial data signal.

19. The electronic device of claim 18, wherein the first data path and the second data path are of a differential type.

20. The memory module of claim 18, wherein the first integrated circuit comprises a finite impulse response filter arranged in the second data path and the finite impulse response filter comprises the second sampling circuit.

21. A method, comprising:
    selectively forwarding data in an integrated circuit via a first data path or via a second data path;
    wherein the forwarding via the first data path comprises:
        receiving a serial data signal,
        parallelizing the serial data signal to generate a parallelized data signal,
        sampling the parallelized data signal, and
        serializing the sampled parallelized data signal; and
    wherein the forwarding via the second data path comprises:
        receiving the serial data signal, and
        sampling the serial data signal.

22. The method of claim 21, comprising:
    generating a sampling clock based on the serial data signal, wherein the sampling of the serial data signal is accomplished based on the sampling clock.

23. The method of claim 21, wherein the sampling of the serial data signal is accomplished in a finite impulse response filter.

24. The method of claim 21, wherein the sampling of the serial data signal is accomplished in a D-flip-flop.

25. The method of claim 21, wherein the integrated circuit comprises a memory circuit coupled to the first data path, and wherein the serial data signal comprises memory read data, memory write data, and/or memory control data.

* * * * *